United States Patent [19]

Marusik

[11] Patent Number: 4,520,275
[45] Date of Patent: May 28, 1985

[54] MASTER AND SLAVE POWER SUPPLY CONTROL CIRCUITS

[75] Inventor: C. Lee Marusik, Allen, Tex.

[73] Assignee: Rockwell International Corporation, El Segundo, Calif.

[21] Appl. No.: 566,358

[22] Filed: Dec. 28, 1983

[51] Int. Cl.³ .............................................. H02G 9/00
[52] U.S. Cl. ...................................... 307/64; 307/85; 307/86
[58] Field of Search .................................. 307/64–66, 307/84–87, 126; 363/69, 70, 72

[56] References Cited

U.S. PATENT DOCUMENTS

| | | | |
|---|---|---|---|
| 4,160,917 | 7/1979 | Wald | 307/85 X |
| 4,386,308 | 5/1983 | Emile, Jr. et al. | 307/66 X |
| 4,426,587 | 1/1984 | Nouet | 307/66 |

Primary Examiner—A. D. Pellinen
Assistant Examiner—Todd E. DeBoer
Attorney, Agent, or Firm—V. Lawrence Sewell; H. Fredrick Hamann

[57] ABSTRACT

A circuit for controlling the connection of master and slave power supplies to a load. In a preferred embodiment, identical circuits on two printed circuit boards are interconnected on the backplane to make one a master circuit and the other a slave circuit, controlled by the master. Means are included in the master and slave circuits for responding to undervoltage and overload conditions to switch the slave power supply on-line and the master supply off-line. Means are further provided to respond to an overload condition resulting from a failure in the master power supply itself by holding the master supply off-line. The circuit avoids disadvantages associated with prior art systems using isolation diodes.

3 Claims, 1 Drawing Figure

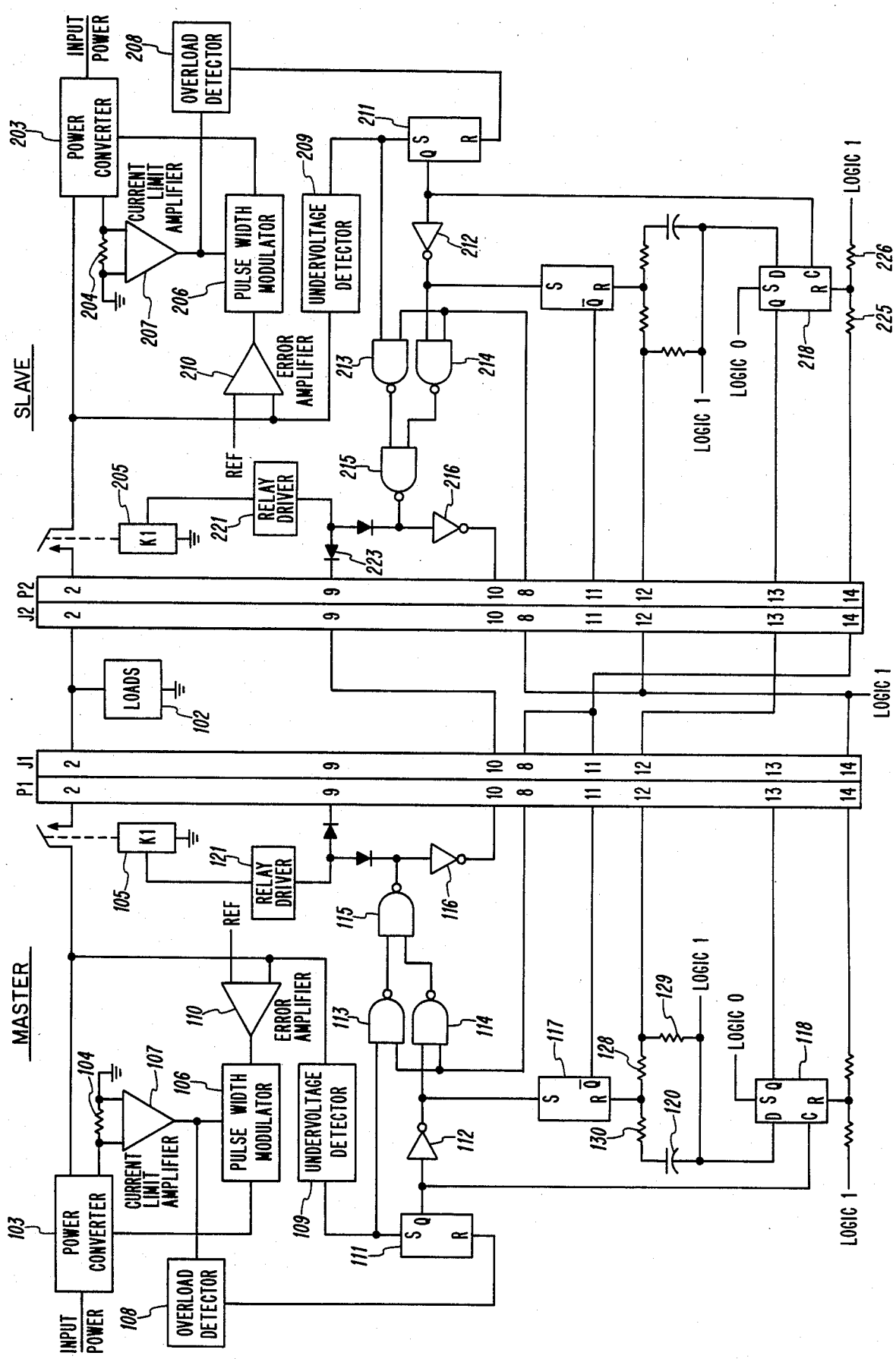

MASTER AND SLAVE POWER SUPPLY CONTROL CIRCUITS

BACKGROUND OF THE INVENTION

This invention relates to controlling the connection of redundant power supplies to loads.

Power supply redundancy is conventionally dealt with by connecting two identical supplies in parallel to a power bus. Only the supply with the higher output voltage setting will deliver power on the bus to the loads. However, a short circuited output in either of the two supplies will overload the power bus and result in the loss of regulated power to the loads.

This problem is circumvented in a second prior art approach by adding an isolation diode in the output of each supply. However, the resulting diode power loss is objectionable for systems with large load currents. In addition, the diode drop will result in poor load regulation for low output voltages, unless remote load sensing is used.

SUMMARY OF THE INVENTION

In accordance with the present invention, there is provided a circuit for controlling the connection of master and slave power supplies to a load. The circuit includes means for switching to the slave supply in response to an undervoltage condition, then returning to the master supply upon the correction of the condition. The circuit further includes means for responding to an overload condition to switch to said slave supply and remain thus switched, until the overload condition ceases.

In a preferred embodiment of the invention, there are identical master and slave circuits, which can be on printed circuit boards, with backplane interconnections being used to operationally render one circuit a master circuit and the other a slave circuit. Such an arrangement is economical to manufacture and maintain. It is a feature of this embodiment, that the off-line circuit board can be removed, without affecting the operation of the on-line circuit.

As contrasted with the prior art approach described above, using isolation diodes, the present invention provides improved power efficiency for a system supplying a large amount of load current. In addition, good load regulation is provided for low output voltages without the need for remote load sensing.

BRIEF DESCRIPTION OF THE DRAWING

The sole FIGURE is a schematic diagram of a circuit in accordance with the invention.

DESCRIPTION OF PREFERRED EMBODIMENT

The FIGURE illustrates the control of power supplies in accordance with the invention. In a preferred embodiment, the supplies and associated controls are implemented on two printed circuit boards connected by connectors P1 and P2 to backplane connectors J1 and J2, respectively. The circuit which, in the drawing, is to the left of connector P1 and connected to it represents circuitry on one printed circuit board. That to the right of connector P2 is the circuit on the other printed circuit board. In the operation to be described, the circuit on the left functions as a master circuit, having its power supply normally on-line. The circuit on the right is the slave circuit, having its power supply normally in the standby mode. Preferably, including for reasons of economy, the master and slave circuits are identical. Their operational roles are selected by backplane wiring, shown in the FIGURE interconnecting terminals of backplane connectors J1 and J2.

In the FIGURE, the load or loads 102 to which power is supplied are connected into the supply system through connector terminals 2. Power is supplied to the loads by power converters 103 and 203 through relays 105 and 205. Each of power converters 103 and 203 can be, for example, a forward converter, a specific example of a switched-mode power converter topology.

Regulation of the output voltage of converter 103 is controlled by error amplifier 110 and pulse width modulator 106 in a manner well understood in the art. Error amplifier 110 compares the output voltage with a reference voltage, and the error voltage output of the amplifier 110 controls pulse width modulator 106 so as to maintain a constant voltage output from power converter 103. Error amplifier 210 and pulse width modulator 206 provide the same kind of control for power converter 203.

A current limit amplifier 107 provides output current limiting when an overload exists on the output of power converter 103. A current sense resistor 104 monitors the return current to the power converter output. For normal loading, the output of the current limit amplifier 107 is held at one of its supply rails. When the current through resistor 104 exceeds a selected percentage of the rated current of the power converter, the current limit amplifier 107 becomes active. Its output causes the pulse width modulator 106 to decrease the magnitude of the power converter output voltage, not allowing the converter output current to increase further. Under these conditions, the error amplifier 107 saturates attempting to maintain the output voltage of power converter 103 constant. Thus, under overload conditions the power converter converts from a constant voltage mode to a constant current mode.

The circuitry including power converter 103, error amplifier 110, pulse width modulator 106, current sense resistor 104 and current limit amplifier 107 will sometimes be referred to herein as the master power supply. Similar circuitry including power converter 203, error amplifier 210, pulse width modulator 206, sense resistor 204 and current limit amplifier 207 will be called the slave power supply.

An overload detector 108 is used to sense that the current limit amplifier 107 has become active, i.e., that an overload exists on the output of the power converter 103. Those skilled in the art will recognize that such an overload detector can be implemented using a comparator which compares the output voltage of current limit amplifier 107 with a fixed reference. Consistent with the other logic of the FIGURE, overload detector 108 and the companion detector 208 in the slave circuitry will be considered to have an output which changes from logic "0" to a logic "1", upon the onset of overload.

Each of undervoltage detectors 109 and 209 detects when the output voltage of the associated power converter drops below a selected fraction of rated voltage. In the exemplary system, the output of undervoltage detector 109 or 209 will change from a logic "1" to a logic "0", upon detection of the undervoltage condition. Such detectors can, like the overload detectors, be implemented with a comparator comparing the power converter voltage with a reference.

No-Fault Conditions

Under no-fault conditions, in the master supply, undervoltage detector 109 outputs a logic "1" to the set input of a flip-flop 111 and to one input of a NAND gate 113. The overload detector outputs a logic "0" to the reset input of flip-flop 111. Under these conditions, the Q output of flip-flop 111 is at logic "1".

The logic "1" at the Q output of flip-flop 111 is applied by inverter 112 as a logic "0" to the set input of a flip-flop 117. At the reset input of flip-flop 117, during power-up, there will be a logic "1", because of the logic "1" applied to one terminal of capacitor 120, which is initially discharged. As a result, the inverted Q output of flip-flop 117 becomes a logic "1" at power-up. After power-up, the reset input may become a logic "0", but there will be no change in the state of the flip-flop output.

The inverted Q output of flip-flop 117 is connected to terminal 11 of connector P1, which is returned to terminal 8 of P1 by backplane interconnection of terminals 8 and 11 on connector J1. The logic "1" output from flip-flop 117 is thus applied to inputs of NAND gates 113 and 114. Since gate 114 receives a logic "0" from inverter 112, its output is a logic "1". Gate 113, receiving a logic "1" from the undervoltage detector provides a logic "0" output. NAND gate 115, receiving the outputs of gates 113 and 114 therefore has a logic "1" output.

In the slave supply, the logic states in the no-fault condition will be the same as described above for the master supply. However, the logic "1" input to NAND gates 213 and 214 is supplied in this case through backplane wiring at pins 8 of connectors J2 and P2.

Relays 105 and 205 operate so as to connect the power converters to loads 102, unless logical "0"'s are applied to the associated relay drivers 121 and 221. NAND gate 115, with its logic "1" output, allows relay 105 to connect the master supply to the loads 102. This same gate output is applied through inverter 116, pins 10 of connectors P1 and J1, pins 9 of connectors J2 and P2 and diode 223 to relay driver 221 in the slave supply. The logic "0" from inverter 116, applied to relay driver 221, disconnects slave power converter 203 from the loads 102.

The inverted Q output of flip-flop 117 is connected by means of pins 11 of connector P1 and J1, pins 14 of connectors P2 and J2 pins 14, and resistor 225 to the reset input of flip-flop 218. Also connected to the reset input of flip-flop 218, through resistor 226, is a logic "1" level. Since the inverted Q output of flip-flop 117 in the no-fault condition is 1, then flip-flop 218 is reset so that its Q output is a logic "0".

Under no-fault conditions, the state of flip-flop 117 is independent of the logic level at its reset input. Therefore, the slave supply may be removed from the system with no change of state at the inverted Q output of flip-flop 117 in the master supply. Accordingly, removal of the slave supply does not effect the state of the relay driver connecting the master supply to loads 102.

Undervoltage Condition

When the master supply undervoltage detector 109 senses an undervoltage condition, its inputs to flip-flop 111 and NAND gate 113 become a logic "0". The state of flip-flop 111 does not change, so the output of inverter 112 remains at a logic "0". The state of flip-flop 117 also remains unchanged, so a logic "1" continues to be supplied to the inputs of NAND gates 113 and 114 from pin 8 of connector P1. As a result, the output of gate 114 remains at a logic "1", but the output of gate 113 changes from a logic "0" to a logic "1". NAND gate 115 responds to this change by outputting a logic "0", causing the master supply to be disconnected from the loads 102 by relay 105. The logic "0" at the output of inverter 116, which results in relay 205 disconnecting the slave supply from loads 102, changes to a logic "1" in the undervoltage condition. Since the output of slave supply NAND gate 215 remains at a logic "1", relay 205 connects the slave supply power converter 203 to the loads.

Overload

If one of the loads 102 develops a fault that results in an overload of the regulated power line from converter 103, master supply current limit amplifier 107 becomes active. This causes pulse width modulator 106 to control power converter 103 so that current to the load will be limited to a preset value. The overload detector then changes the reset input of flip-flop 111 from a logic "0" to a logic "1". By itself, this does not change the output state of flip-flop 111.

A continued increase in the overload will be accompanied by a corresponding drop in the output voltage of converter 103. When the output voltage reaches the threshold of the undervoltage detector 109, the undervoltage detector output changes to a logic "0". This causes the output of NAND gate 113 to change to a logic "1" and NAND gate 115 to output a logic "0" As in the case of the undervoltage condition described above, the presence of a logic "0" at the output of gate 115 initiates disconnection of the master supply from loads 102 and connection of the slave supply.

The change in output state of undervoltage detector 109 also changes the set input of flip-flop 111 to a logic "0". This causes the Q output of the flip-flop to change to a logic "0", driving the set input of flip-flop 117 to a logic "1". As a result, the inverted Q output of flip-flop 117 becomes a logic "0", thereby disabling NAND gates 113 and 114. In this condition, the outputs of NAND gates 113 and 114 must remain at logic "1", regardless of the states of the other inputs to the gates. Thus, the output of NAND gate 115 is locked at a logic "0" until flip-flop 117 is reset. In this state, the master supply is disconnected from the loads, while the slave supply is allowed to be on-line.

The change in the inverted Q output of flip-flop 117 causes the reset input of flip-flop 218 in the slave supply to go to a logic "0". However, the Q output of flip-flop 218 remains at logic "0".

Overload—Fault in the Load

If the fault causing the overload is in some portion of loads 102, then the master supply will cease detecting any overload condition, as soon as it is disconnected from the loads. However, the master supply remains off-line, as follows. After the transfer of the load from the master supply to the slave supply, the output of the master supply overload and undervoltage detectors 108 and 109 return to their no-fault states, logic "0" and logic "1" respectively. The appearance of a logic "1" at the set input of flip-flop 111 causes the Q output of that flip-flop to return to a logic "1". However, flip-flop 117 continues to output a logic "0", because both its set and reset inputs are at logic "0". Therefore, NAND gates 113 and 114 remain disabled and the output of NAND gate 115 is "locked" at logic "0", holding the slave supply on-line and the master supply off-line.

Once the slave supply is connected to the loads 102, its overload detector 208 and undervoltage detector 209 will respond to the overload just as in the master supply, causing the Q output of flip-flop 111 to change from logic "1" to logic "0". Then both inputs to NAND gate 214 will be logic "1", so the output of gate 214 will be a logic "0". This locks NAND gate 215 to a condition with a logic "1" output, thereby maintaining the slave supply connected to loads 102 and supplying them with a limited current.

Generally, as the resistance of a faulty load continues to decrease, it increases its share of the limited current available from the slave supply, until the input fuse of the faulty load blows. Then the overload detector 208 and undervoltage detector 209 of the slave supply will sense that the overload condition has been removed. The output of the undervoltage detector returns to a logic "1", setting flip-flop 211, so that its Q output returns to a logic "1". The inputs to NAND gates 213 and 214 during this transition are such that the output of NAND gate 115 remains at logic "1", keeping the slave supply connected to the remaining loads.

A final sequence of events returning the power supplies to their no-fault state is initiated by the positive going transition of the flip-flop 211 output. This transition clocks a logic "1" onto the Q output of flip-flop 218. The output of flip-flop 218 is connected by way of pins 13 of connectors P2 and J2 and pins 12 of connectors P1 and J1 to the junction of resistors 128 and 129 in the master supply. After a time delay determined by capacitor 120 and by resistors 128 and 130, the reset input of flip-flop 117 reaches logic "1". This causes the inverted Q output of flip-flop 117 to return to a logic "1", "unlocking" the output of NAND gate 115 from the logic "0" state. Therefore, relay 105 connects the master supply to the loads 102, and relay 205 disconnects the slave supply.

The logic "1" at the output of flip-flop 117 is also connected to the reset input of flip-flop 218 in the slave supply. This resets the Q output of flip-flop 218 to a logic "0". Then after a time delay determined by capacitor 120, resistor 128 and resistor 130, the reset input of master supply flip-flop 117 reaches logic "0". However, since the set input of flip-flop 117 is already at logic "0", the inverted Q output of flip-flop 117 remains at logic "1". At this point, all the flip-flops in the system have returned to their no-fault states.

Thus, for an overload resulting from a fault in loads 102, the system can switch the master supply off-line and the slave supply on-line for the duration of the fault. Then, as the fault is removed, the master supply switches back on-line, while the slave supply returns off-line.

Overload—Fault in the Master Supply

If a fault in the master supply causes an overload condition, that supply is switched off-line and the slave supply is brought on-line, just as described for a fault in one of the loads. Once the load transfer has been completed, however, the master supply continues to recognize an overload condition on its output. So long as the overload detector 108 provides a logic "1" to the reset input of flip-flop 111 and undervoltage detector 109 provides a "0" to the set input of the flip-flop, the logic states in the master supply remain unchanged after load transfer. Nor are there any changes of state of the flip-flops in the slave supply after the load transfer. The slave supply is connected to the loads 102, because of the logic ones applied at its relay driver control inputs. Since the slave supply does not detect any fault upon disconnection of the master supply, it continues to deliver power to the loads until the master supply is replaced with a properly functioning unit. At that time, the master supply will switch back on-line and the slave supply off-line, as described for a fault in the loads.

I claim:

1. A circuit for controlling the connection of master and slave power supplies to a load, comprising:
    means for connecting said master supply to said load and disconnecting said slave supply from said load, under no-fault conditions;
    means for responding to an undervoltage condition at said master supply to disconnect said master supply from said load and connect said slave supply thereto, and further, upon cessation of said undervoltage condition, for connecting said master supply to said load and disconnecting the slave supply therefrom;
    latching means, responsive to the occurrence of both overload and undervoltage conditions at said master supply, for disconnecting said master supply from said load and connecting said slave supply thereto, and preventing the connection of said master supply to said load and disconnection of said slave supply therefrom, upon the cessation of said overload condition or said undervoltage condition at said master supply;
    means for detecting the occurrence and cessation of a concurrent overload and undervoltage condition at said slave supply; and
    means for responding to the detection of the cessation of said concurrent overload and undervoltage condition at said slave supply to enable said latching means to connect said master supply to said load and disconnect said slave supply therefrom, provided that a concurrent overload and undervoltage condition is not present at said master supply.

2. Combined master and slave circuits for controlling the connection of master and slave power supplies, respectively, to a load, said circuits comprising:
    first switching means, included in said master circuit, for connecting said master supply to said load, except upon receipt of a selected signal;
    second switching means, included in said slave circuit, for connecting said slave supply to said load, except upon receipt of said selected signal;
    means included in said master circuit for providing said selected signal to said second means and not to said first means, under no fault conditions;
    means included in said master circuit for responding to an undervoltage condition at said master supply to provide said selected signal to said first switching means and to remove said selected signal from said second switching means and further, upon cessation of said undervoltage condition, for removing said selected signal from said first switching means and providing said selected signal to said second switching means;
    means, included in said slave circuit, for responding to an undervoltage condition at said slave supply to provide said selected signal to said second switching circuit and to remove said selected signal therefrom upon the cessation of said undervoltage condition at said slave supply;

latching means, included in said master circuit, responsive to the occurrence of both overload and undervoltage conditions at said master supply, for providing said selected signal to said first switching means, removing said selected signal from said second switching means and preventing the removal of said selected signal from said first switching means and the application of said selected signal to said second switching means, upon the cessation of said overload condition or said undervoltage condition at said master supply;

means, included in said slave circuit, for detecting the occurrence and cessation of a concurrent overload and undervoltage condition at said slave supply; and means, included in said master circuit, for responding to the detection of the cessation of said concurrent overload and undervoltage condition at said slave supply to enable said latching means to remove said selected signal from said first switching means and provide said selected signal to said second switching means, provided that a concurrent overload and undervoltage condition is not present at said master supply.

3. A system for controlling the connection of master and slave power supplies to a load, comprising:

a master circuit and a slave circuit, each having one of said power supplies associated therewith and including:

switching means for connecting the associated one of said power supplies to said load, except upon receipt of a selected signal, including at a first terminal;

means for outputting said selected signal to a second terminal under no-fault conditions;

means for responding to an undervoltage condition at the associated power supply to provide said selected signal to the switching means of the same circuit and to cease said outputting of said selected signal, and upon cessation of said undervoltage condition, for removing said selected signal from the switcning means of the same circuit and resuming said outputting of said selected signal;

latching means, responsive to the occurrence of a concurrent overload and undervoltage condition at the associated power supply, for providing said selected signal to the switching means of the same circuit, ceasing said outputting said selected signal, storing and providing to a third terminal an output indicative of said occurrence of said concurrent overload and undervoltage condition, and responding to an input at a fourth terminal to cease providing said output to the third terminal;

means responsive to a fifth terminal for preventing the removal of said selected signal from the switching means of the same circuit and preventing the resumption of said outputting of said selected signal; and means for detecting the cessation of said concurrent overload and undervoltage condition and outputting an indication thereof at a sixth terminal;

means for interconnecting said second terminal of said master circuit and the first terminal of the switching means of the slave circuit, whereby said outputting of said selected signal at said second terminal disconnects said slave power supply from the load., means for interconnecting said third and fifth terminals of said master circuit, so as to prevent the removal of said selected signal from the switching means of the master circuit and the application of said selected signal to the switching means of the slave circuit, upon cessation of a concurrent overload and undervoltage condition at said master supply; and means for interconnecting said sixth terminal of the slave circuit and said fourth terminal of the master circuit so as to enable the removal of said selected signal from the switching means of the master circuit and resumption of said outputting of the selected signal at said second terminal, provided that a concurrent overload and undervoltage condition is not present at said master supply.

* * * * *